United States Patent [19]
Ang

[11] Patent Number: 5,620,581
[45] Date of Patent: Apr. 15, 1997

[54] APPARATUS FOR ELECTROPLATING METAL FILMS INCLUDING A CATHODE RING, INSULATOR RING AND THIEF RING

[75] Inventor: Jane Ang, San Mateo, Calif.

[73] Assignee: AIWA Research and Development, Inc., Fremont, Calif.

[21] Appl. No.: 564,508

[22] Filed: Nov. 29, 1995

[51] Int. Cl.[6] .................. B05B 5/025; C25D 5/00; C25D 7/12; C25B 15/00
[52] U.S. Cl. .................. 205/96; 205/97; 205/157; 204/228; 204/231; 204/297 R; 118/624; 118/625; 118/500
[58] Field of Search .................. 204/228, 231, 204/297 R; 205/96, 97, 157, 255; 118/624, 625, 500

[56] References Cited

U.S. PATENT DOCUMENTS

| | | | |
|---|---|---|---|
| 3,880,725 | 4/1975 | Van Raalte et al. | 204/15 |
| 4,304,641 | 12/1981 | Grandia et al. | 204/23 |
| 4,696,729 | 9/1987 | Santini | 204/224 |
| 5,078,852 | 1/1992 | Yee et al. | 204/297 |
| 5,169,684 | 12/1992 | Takagi | 118/500 |
| 5,312,532 | 5/1994 | Andricacos et al. | 204/231 |

FOREIGN PATENT DOCUMENTS 5-243183  9/1993  Japan.

*Primary Examiner*—Kathryn L. Gorgos
*Assistant Examiner*—Edna Wong
*Attorney, Agent, or Firm*—Skjerven, Morrill, MacPherson, Franklin & Friel, L.L.P.

[57] ABSTRACT

Multiple-layer thin film devices are deposited by electroplating on an otherwise substantially clean substrate wafer. The composition of the electroplated alloy layers is maintained substantially uniform using a cathode assembly on which the substrate wafer is mounted. The cathode assembly includes an inner cathode ring electrically connected to the wafer, a thief ring external to the cathode ring and an insulating ring connected between and electrically insulating the cathode and thief rings. The cathode ring and the thief ring are powered by separate power sources.

18 Claims, 7 Drawing Sheets

APPARATUS FOR ELECTROPLATING METAL FILMS INCLUDING A CATHODE RING, INSULATOR RING AND THIEF RING

FIELD OF INVENTION

The present invention relates to electroplating techniques and structures. Specifically, the present invention relates to techniques and structures for electrodepositing alloy metallic films having a uniform composition and thickness.

BACKGROUND OF THE INVENTION

Electroplating, the application of a metal to the surface of a material by electrolysis, is typically used in the fabrication of thin film devices to produce relatively thick layers of metal. The electroplating process involves applying an electrical energy source to vary the electropotential of a substrate workpiece in the presence of an electroplating solution.

One of the problems in the use of electroplating is the difficulty in maintaining a suitable uniformity in thickness and composition of deposited films. In the fabrication of thin film devices, such as magnetic core elements of thin film heads, advantages are achieved by fabricating the devices using a Permalloy material. The chemical description of a Permalloy material is NiFe. The iron content (Fe) of Permalloy is typically precisely controlled, in one example to 18 percent by weight. The process of electroplating a large alumina wafer, for example a 6 inch diameter circular wafer, typically dictates usage of an electroplating procedure resulting in a substantially uniform iron (Fe) concentration across the entire wafer. FIG. 1 is a pictorial diagram of a circular wafer 100, such as a six inch circular wafer, including a plurality of devices 110 which are fabricated using thin-film processes.

The nature of electrolytic plating of a substrate wafer is that the current density applied to the substrate is substantially greater at the periphery of the wafer than near the wafer center. FIG. 2 illustrates various regions of the circular wafer 100 having different current densities. A low current-density region 112 exists at the center of the wafer 100. A medium current-density region 114 surrounds the low current-density region 112. A high current-density region 116 encloses the medium current density region 114. These regions are for illustrative purposes since the current density varies continuously from the center of the wafer 100 to the periphery of the wafer 100. This higher current density results in an increased deposition rate of plated film at the periphery of the wafer. It follows that the film plating thickness is increased at the peripheral edges of the wafer as compared to the wafer interior. In the case of deposition of permalloy, an alloy of nickel and iron, the concentration of iron (Fe) is higher at the periphery of the wafer due to the higher current density in the peripheral region.

Problems of nonuniform deposition of thin films are accentuated for large wafers. For example, in large diameter circular wafers having a diameter of 6 inches or greater, deposition composition and thickness control is a very difficult problem.

The thin film thickness differences between the interior and periphery of a wafer cause practical difficulties in plating of specific structures. Illustratively, one type of selected electroplated structure, for example plating of a large bottom pole 310 having a length of 200 μm and a width of 10 μm shown in FIG. 3, may have an iron content of 18% in the center region of the wafer, and 20% iron content in the periphery of the wafer. (Note that FIG. 3 is not drawn to scale.) Thus, the electroplating current distribution varies significantly in different regions of the wafer, resulting in a substantial variation in iron composition. Such a large variability in composition is not acceptable.

What is needed is a simple and cost-effective electroplating technique and system which maintains a substantially uniform metal composition and thickness while constructing thin film structures composed of a large number of thin film layers.

SUMMARY OF THE INVENTION

In accordance with the present invention, multiple-layer thin film devices are deposited by electroplating on an otherwise substantially clean substrate wafer. The composition of the electroplated layers is maintained substantially uniform using a cathode assembly on which the substrate wafer is mounted. The cathode assembly includes an inner cathode ring electrically connected to the wafer, a thief ring external to the cathode ring and an insulating ring connected between and electrically insulating the cathode and thief rings. The cathode ring and the thief ring are powered by separate power sources.

In accordance with a first embodiment of the present invention, an apparatus for electroplating metal films onto a workpiece includes a cathode ring having a flanged inner surface for holding the workpiece for electroplating and a notched outer surface. An insulator is connected to the outer surface of the cathode ring, having a flanged inner surface for nesting with the notched outer surface of the cathode ring and a notched outer surface. A thief ring is connected to the outer surface of the insulator ring, having a flanged inner surface for nesting with the notched outer surface of the insulator ring. The cathode ring is connected to a first negative terminal of a power supply, supplying a cathode current to the workpiece. The thief electrode is connected to a second negative terminal of a power supply, separate from the first negative terminal, for supplying a thief current.

In accordance with a second embodiment of the present invention, a method of electroplating a thin metal film onto a substrate wafer includes the steps of electroplating an otherwise substantially clean substrate wafer and maintaining a chemical composition of the electroplated layers substantially uniform using a cathode assembly for mounting the substrate wafer. The cathode assembly includes an inner cathode ring electrically connected to the wafer, a thief ring external to the cathode ring and an insulating ring connected between and electrically insulating the cathode and thief rings. The method also includes the step of powering the cathode ring and the thief ring using separate power sources.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION

Figure 4:
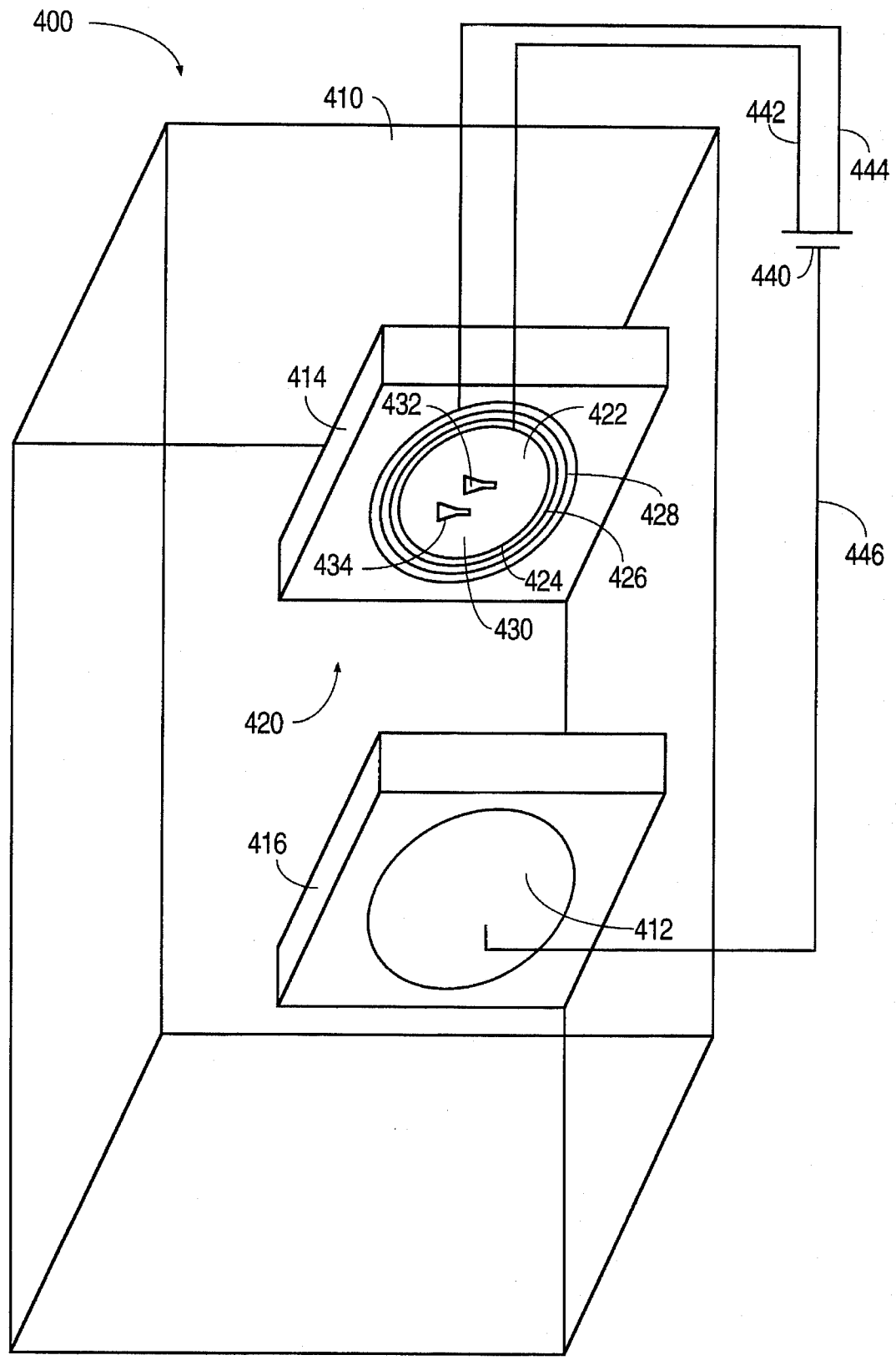
FIG. 4 is a pictorial schematic diagram of an electroplating system in accordance with an embodiment of the present invention.

Referring to FIG. 4, an electroplating system 400 is shown which includes an electroplating cell 410 containing an electroplating solution. Electrodes within the electroplating cell 410 are furnished in an anode 412 and a cathode assembly 420 supported by respective plexiglass blocks 414 and 416. A workpiece, typically a substrate water 430, is mounted in a central aperture 422 of the cathode assembly 420. Thin film metal components 432 and 434 are fabricated on the substrate wafer 430. The substrate wafer 430 is, for example, a 6 inch radius wafer. The cathode assembly 420 includes an inner cathode ring 424, an intermediate insulator ring 426 and an outer thief ring 428. An adjustable dual-channel power supply 440 has two negative terminals 442 and 444 and a common positive terminal 446. The positive terminal 446 is connected to the anode 412. A first negative terminal 442 is connected to the cathode ring 424. A second negative terminal 444 is connected to the thief ring 428. Accordingly, the cathode ring 424 and thief ring 428 share one anode on the same adjustable dual channel power supply 440.

Figure 5:
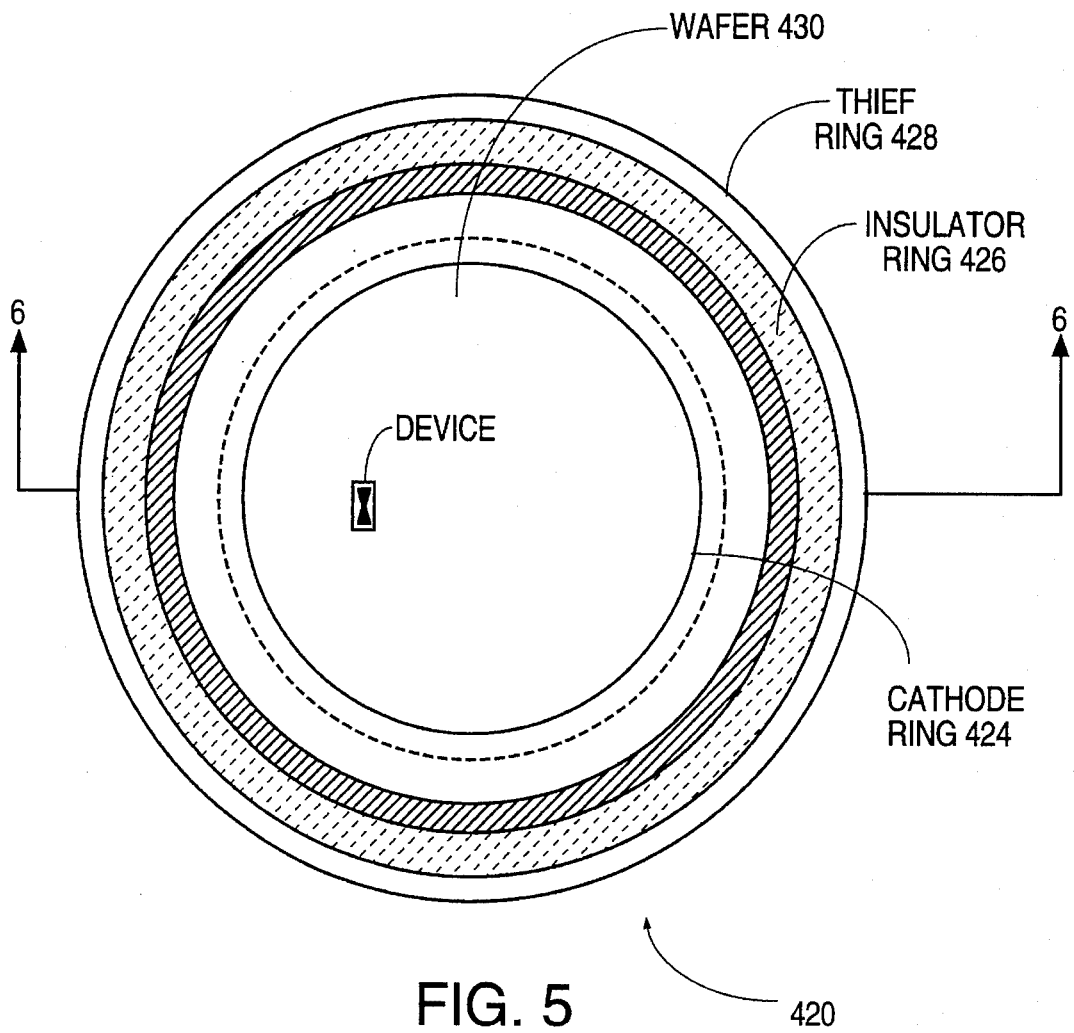
FIG. 5 is a top view of a cathode assembly and workpiece utilized in the electroplating system shown in FIG. 4.
Figure 6:
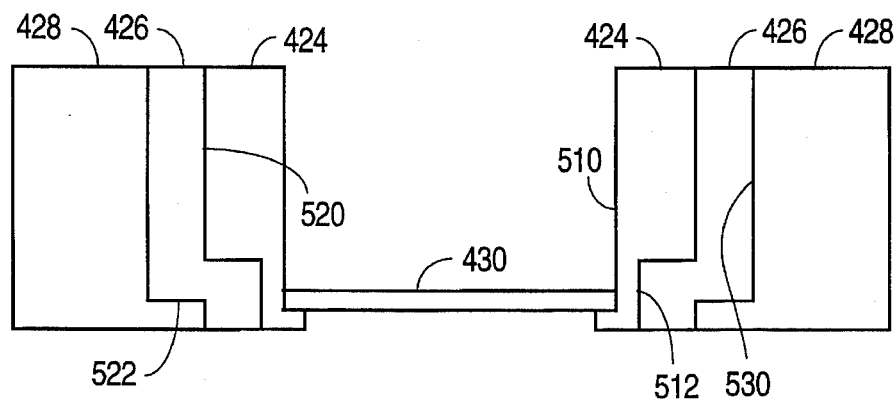
FIG. 6 is a cross-sectional view of the cathode assembly and workpiece shown in FIG. 3.

Referring to FIGS. 5 and 6, the cathode assembly 420 is shown in greater detail. The cathode ring 424 has a flanged inner surface 510, which holds the substrate wafer 430 in electrical contact, and a notched outer surface 512. The insulator ring 426 is connected to the outer surface 512 of the cathode ring 424 so that the notched outer surface 512 nests with a flanged inner surface 520 of the insulator ring 426. The insulator ring 426 also has a notched outer surface 522. The thief ring 428 is connected to the outer surface 522 of the insulator ring 426 so that the notched outer surface 522 nests within a flanged inner surface 530 of the thief ring 428.

The cathode ring 424 is a metallic ring. In one embodiment, the cathode ring 424 is constructed from stainless steel.

The thief ring 428 is connected to the second negative terminal 444, which is separated from the first negative terminal 442, connected to the cathode ring 424. The adjustable dual channel power supply 440 drives the cathode current during the electroplating operation by a connection via the first negative terminal 442. When electroplating is in progress and the adjustable dual channel power supply 440 is driving both first negative terminal 442 and second negative terminal 444, the thief ring 428 "steals away" iron (Fe) ions from the edge of the substrate wafer 430. When a NiFe permalloy is electroplated, a higher current density arises in a region at the periphery of the substrate, yielding a higher concentration of iron in this peripheral region. Utilization of the thief ring 428 and, more specifically, utilization of a thief ring 428 in which the thief current is adjustable, advantageously allow a substantial reduction in iron concentration around the periphery of the wafer. In other words, availability of iron ions near the peripheral edge area of the wafer 430 is reduced because electroplating is occurring on the thief ring 428. As a result, the thin film electroplated onto the substrate wafer 430 is deposited more uniformly, in terms of NiFe composition, because iron ions that migrate to form a high concentration at the peripheral edge area of the substrate wafer 430 are pulled off the wafer 430 onto the thief ring 428.

The insulator ring 426 furnishes insulation between the cathode ring 424 and the thief ring 428. FIG. 6 shows one embodiment of an insulator ring 426 where the outer edge has a lip extending upward and the inner edge has a lip extending downward so as to have a substantially "Z-shaped" cross-sectional form. The illustrative insulator ring 426 is a plastic insulator ring which is sized to fit tightly around the cathode ring 424. A plastic insulator ring advantageously furnishes a durable insulating layer. The plastic insulator ring may be either a machined ring or a molded ring. A machined is preferred.

Figure 7:
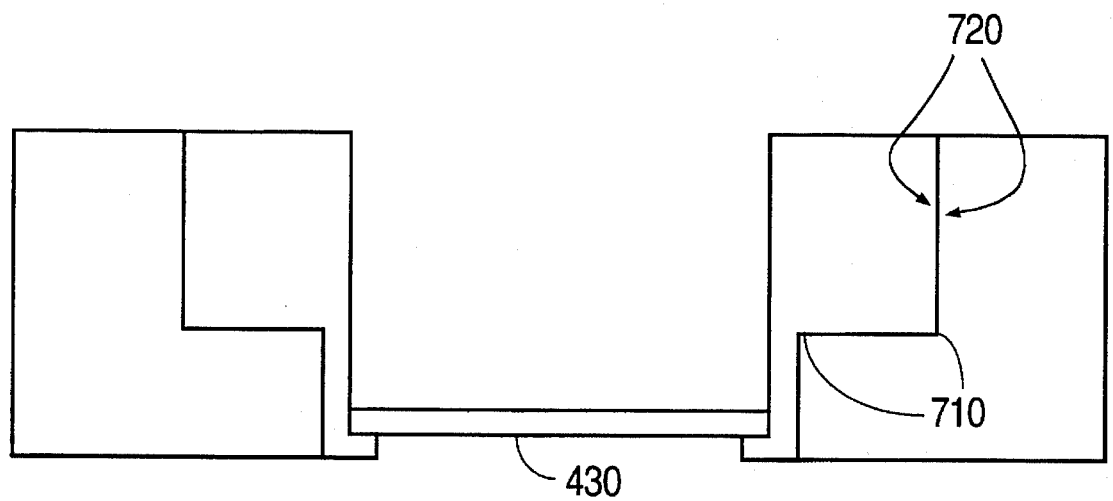
FIG. 7 is a cross-sectional view of the cathode assembly which illustrates locations in which insulation is typically weak.

Other insulating techniques, for example, coating the outer surface 512 of the cathode ring 424 with Teflon™ or Kyner™, forms an insulating layer between a cathode ring and a thief ring that inadequately coats the cathode ring. Using this insulating technique, sharp edges 710 and vertical surfaces 720 of the cathode ring, as shown in FIG. 7, do not receive an adequate insulating coating, unfortunately is associated with breakdown in the insulation between the cathode and thief ring, possibly resulting in short-circuiting.

Figure 8:
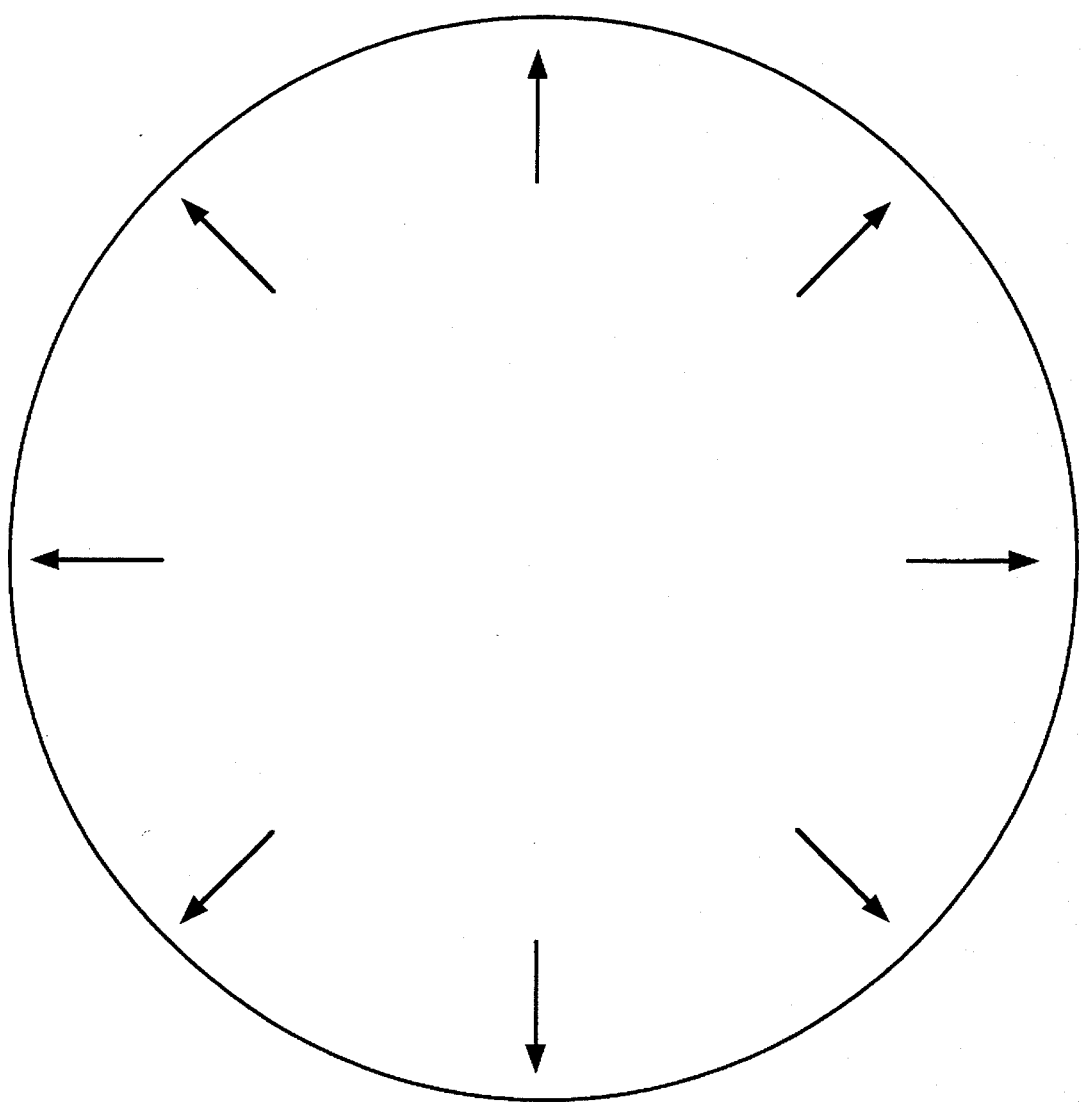
FIG. 8 is a top view of a substrate wafer workpiece which illustrates current density of the wafer undergoing electroplating processing.

In operation, a substrate wafer 430 is electroplated by placing the edges of the wafer onto the inner flange 510 of the cathode ring 424, which is electrically connected to the first negative terminal 442 of the adjustable dual channel power supply 440. The cathode ring 424 is connected to the seed layer on the substrate wafer 430, which acts as the cathode in the electrolytic plating process. Thus the ring is called the "cathode ring". One characteristic of the plating process is absent is that the current density is substantially greater at the edge of the substrate wafer 430 near the cathode ring 424, as is shown in FIG. 8. The thief ring 428 "steals" away some of the Fe ions at the edge of the substrate wafer 430 so that, although the current density remains high at the outer portion of the wafer 430, excess Fe ions are drawn off the outer portion of the wafer 430 by the thief ring 428 and plated onto the thief ring 428.

Figure 1:
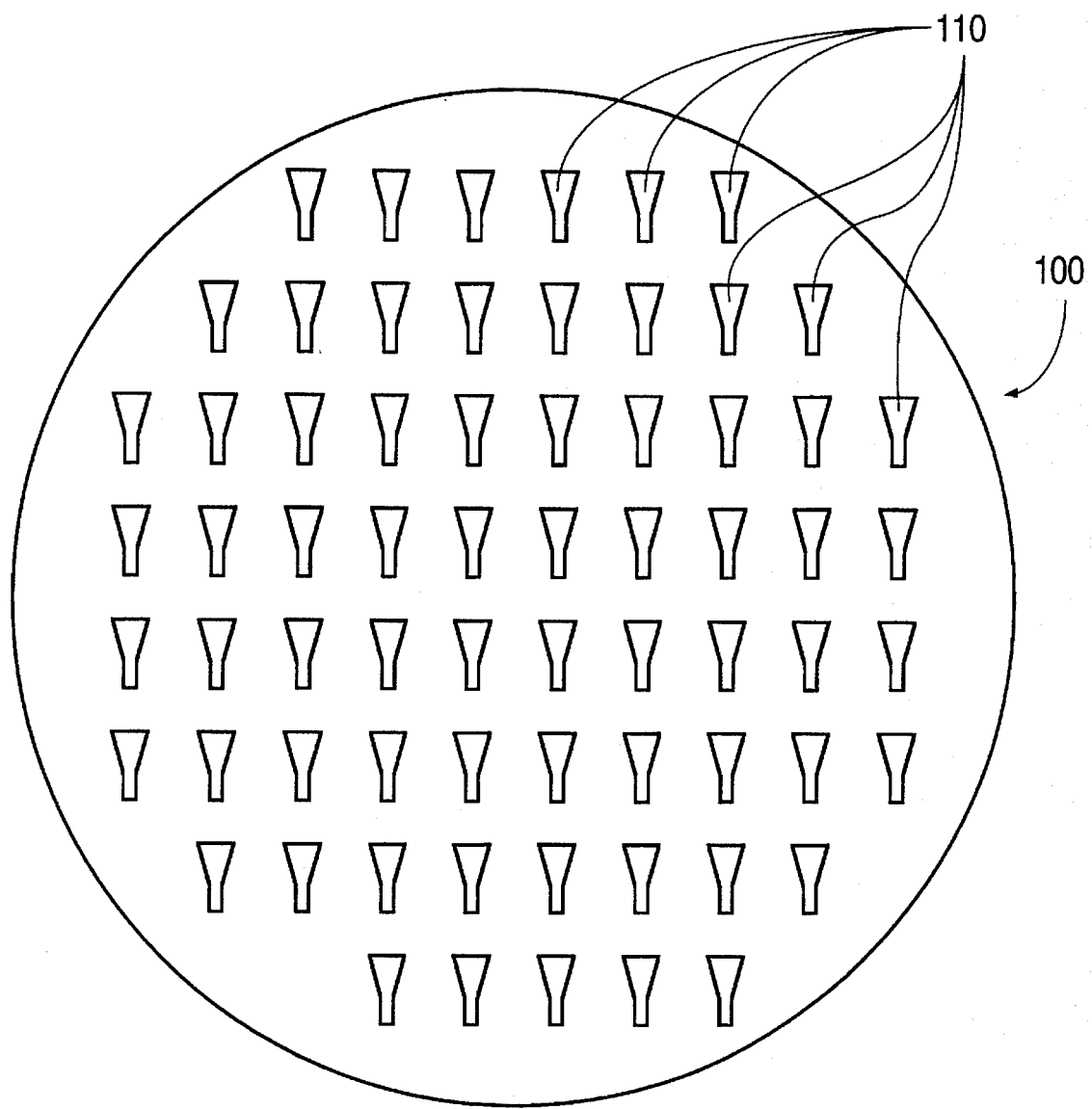
FIG. 1 is a top view of a thin film head wafer which serves as a substrate for fabrication of a plurality of thin film components using an electroplating process.
Figure 2:
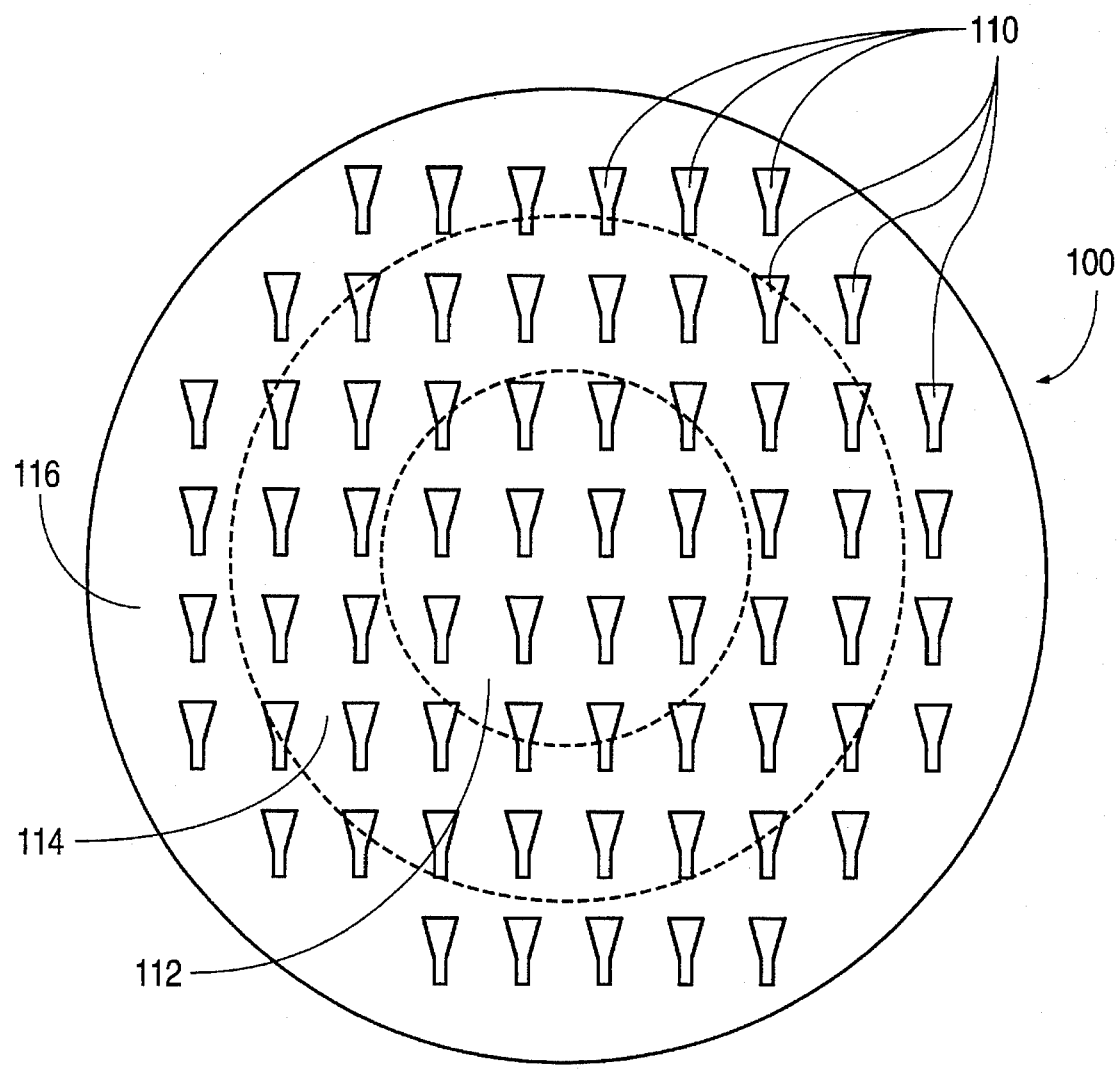
FIG. 2 is a top view of a thin film head wafer shown in FIG. 1 but also illustrating regions of the wafer having different current density characteristics.
Figure 3:
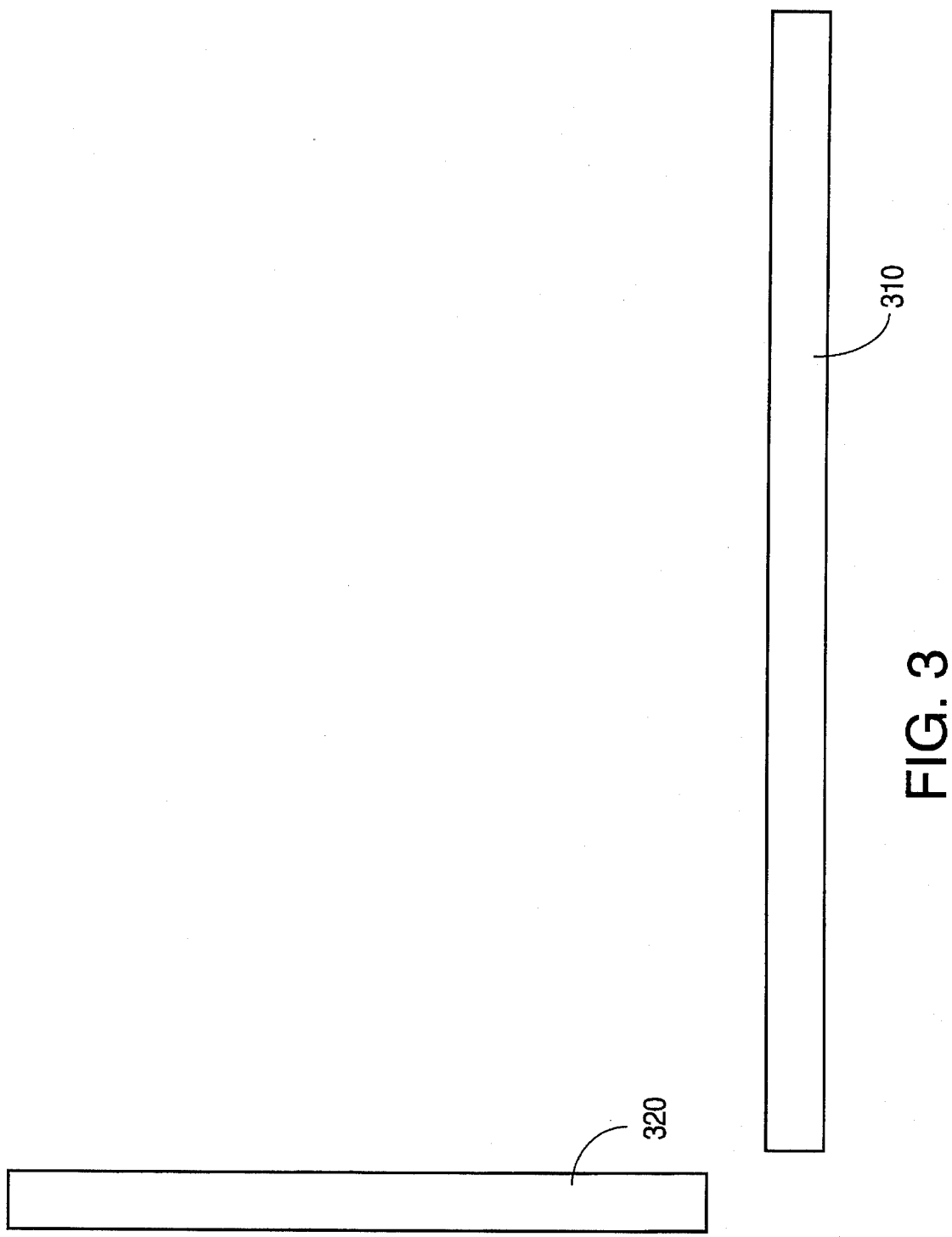
FIG. 3 is a schematic diagram showing a structure which is fabricated using an electroplating system.

The second negative terminal 444 of the adjustable dual channel power supply 440 is controlled to vary the thief current density of the thief ring 428. By controlling the thief current density, the metal composition of the electroplated metal film is controlled. The thief current density is adjusted (increased or decreased) according to the particular iron (Fe) concentration desired at the periphery of the substrate. In one example, the large bottom pole structure 310 shown in FIG. 3 may be electroplated with the second negative terminal of the adjustable power supply regulated to achieve a thief current density of 3.0 Amperes per square foot, a lower current density than is used to electroplate the small side pole structure 320. The small side pole structure 320 may be plated at a thief current density of 4 to 5 amperes per square foot. Separate negative terminals 442 and 444 of adjustable dual channel power supply 440 are employed to generate separately-controlled current densities to the thief ring 428 and the cathode ring 424. The insulator ring 426 between the cathode ring 424 and the thief ring 428 is furnished to maintain these different current densities.

The description of certain embodiments of this invention is intended to be illustrative and not limiting. Numerous other embodiments will be apparent to those skilled in the art, all of which are included within the broad scope of this invention. For example, the anode, cathode and insulator elements of the cathode assembly are described as ring elements. The ring elements are most suitable for electroplating of structures on a circular wafer. However, the invention is just as applicable to other noncircular shapes and structures. Accordingly, the electroplating structure and method is applicable to noncircular structures that form a closed path and also noncircular structures that do not form a closed path.

What is claimed is:

1. A method of electroplating a thin metal film onto a workpiece comprising the steps of:

placing the workpiece into an interior aperture of a cathode assembly, the cathode assembly including:
      a cathode ring having a notched outer surface and a flanged inner surface for holding the workpiece in electrical contact;
      an insulator ring coupled to the outer surface of the cathode ring, having a flanged inner surface for nesting with the notched outer surface of the cathode ring and a notched outer surface; and
      a thief ring coupled to the outer surface of the insulator ring, having a flanged inner surface for nesting with the notched outer surface of the insulator ring;

positioning the workpiece and cathode assembly in an electroplating cell having an anode therein;

applying an electroplating solution to the workpiece within the electroplating cell;

conducting a current between the anode and cathode ring powered by a first power source; and conducting a current in the thief ring powered by a second power source.

2. A method according to claim 1 wherein:
   the first power source is a first negative terminal of a dual-channel power supply; and
   the second power source is a second negative terminal of the dual-channel power supply.

3. A method according to claim 1 further comprising the step of:
   adjusting the second power source to modify the thief current density to optimize alloy composition uniformity of the electroplated thin metal film.

4. A method according to claim 1 further comprising the step of:
   insulating the cathode ring from the thief ring where the insulating ring used has a substantially "Z-shaped" cross-sectional shape.

5. A method according to claim 1 further comprising the step of:
   insulating the cathode ring from the thief ring using a plastic insulator ring.

6. An electroplating system comprising:

an electroplating cell containing an electroplating solution;

an anode disposed within the electroplating cell;

a cathode assembly disposed within the electroplating cell including:
      a cathode ring having a flanged inner surface for holding the workpiece for electroplating and a notched outer surface;
      an insulator ring coupled to the outer surface of the cathode ring, having a flanged inner surface for nesting with the notched outer surface of the cathode ring and a notched outer surface; and
      a thief ring coupled to the outer surface of the insulator ring, having a flanged inner surface for nesting with the notched outer surface of the insulator ring.

7. A system according to claim 6 further comprising:
   a first power source coupled to the cathode ring and the anode; and
   a second power source, controlled separately from the first power source, coupled to the thief ring for supplying a thief current.

8. A system according to claim 7 wherein: the first power source is a first negative terminal of a dual-channel power supply; and the second power source is a second negative terminal of the dual-channel power supply.

9. A system according to claim 7 wherein the second power source is adjusted to modify the thief current density to control an alloy composition uniformity of the electroplated metal film.

10. A system according to claim 6 wherein the insulator ring has a substantially "Z-shaped" cross-sectional shape.

11. A system according to claim 6 wherein the insulator ring is a plastic insulator ring.

12. A cathode assembly apparatus comprising:

a cathode ring having a flanged inner surface for holding the workpiece for electroplating and a notched outer surface;

an insulator ring coupled to the outer surface of the cathode ring, having a flanged inner surface for nesting with the notched outer surface of the cathode ring and a notched outer surface; and a thief ring coupled to the outer surface of the insulator ring, having a flanged inner surface for nesting with the notched outer surface of the insulator ring.

13. An apparatus according to claim 12 wherein:
    the cathode ring is coupled to a first power source for supplying a cathode current; and
    the thief ring is coupled to a second power source, separate from the first power source, for supplying a thief current.

14. An apparatus according to claim 13 wherein the first and second separate power sources include:
    a first negative terminal of a dual-channel power supply; and
    a second negative terminal of the dual-channel power supply.

15. An apparatus according to claim 13 wherein the second power source is adjusted to modify the thief current density to select a metal composition uniformity of the electroplated metal film.

16. An apparatus according to claim 12 wherein the insulator has a substantially "Z-shaped" cross-sectional shape.

17. An apparatus according to claim 12 wherein the insulator is a plastic insulator.

18. An apparatus according to claim 12 wherein the cathode, insulator and thief rings each form closed curve structures, the cathode ring nesting within the closed curve structure of the insulator and the insulator and cathode ring nesting within the closed curve structure of the thief ring.

* * * * *